US006674316B2

(12) United States Patent
Romas, Jr. et al.

(10) Patent No.: US 6,674,316 B2
(45) Date of Patent: Jan. 6, 2004

(54) METHODS AND APPARATUS FOR TRIMMING ELECTRICAL DEVICES

(75) Inventors: Gregory G. Romas, Jr., McKinney, TX (US); Jian Wang, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/121,193

(22) Filed: Apr. 12, 2002

(65) Prior Publication Data

US 2003/0193361 A1 Oct. 16, 2003

(51) Int. Cl.[7] .................................................. H03L 5/00
(52) U.S. Cl. ........................................ 327/308; 327/525
(58) Field of Search ................................ 327/308, 525, 327/526, 530

(56) References Cited

U.S. PATENT DOCUMENTS 4,225,878 A * 9/1980 Dobkin ....................... 257/530
4,412,241 A 10/1983 Nelson
4,451,839 A 5/1984 Nelson
5,079,516 A 1/1992 Russell et al.
6,157,241 A 12/2000 Hellums
6,169,393 B1 * 1/2001 Hashimoto .................. 323/354

* cited by examiner

*Primary Examiner*—Kenneth B. Wells
(74) *Attorney, Agent, or Firm*—Jacqueline J. Garner; W. James Brady, III; Frederick J. Telecky, Jr.

(57) ABSTRACT

Trimming methods and apparatus are disclosed for selectively removing resistance between first and second nodes in an electrical device, including trim circuits comprising a resistor and a diode formed in the resistor body having a conductive portion which may be selectively melted to short the resistor. A multi-bit trim cell is disclosed having trim cells individually comprising a resistor with a diode formed in the resistor body for selectively shorting the resistor, and a fuse for selectively disconnecting the diode from a trim pad.

29 Claims, 17 Drawing Sheets

METHODS AND APPARATUS FOR TRIMMING ELECTRICAL DEVICES

FIELD OF INVENTION

The present invention relates generally to electronic devices and more particularly to improved trim circuitry and methods for trimming electronic devices.

BACKGROUND OF THE INVENTION

Trim circuits are found in many types of electrical devices where a voltage, current, or other operational parameter of a device needs to be adjusted, either during or following manufacturing. Such trim circuitry typically provides a resistance between two nodes in an integrated circuit device, which may be selectively removed, in whole or in part, from the circuit upon application of voltages or currents to trim pads in the device. Trim circuits often employ zener diodes connected in parallel with the resistor to be removed, where the application of an appropriate trim voltage across the diode terminals short-circuits the resistor, sometimes referred to as "blowing" the diode.

In other trim circuits, open-circuits may be selectively created so as to adjust the device performance. In this instance, fuses are often formed in the trim circuit, which can be selectively open circuited by conducting a fuse trim current through the fuse, sometimes referred to as "blowing" the fuse. Such trim circuits, including fuse types and diode types, find application in a wide variety of electrical devices. For instance, trim circuits are often employed in voltage reference or regulator devices wherein one or more reference voltages generated by the device are adjusted during the manufacturing process, such as prior to packaging individual devices.

Many such trim cells may be cascaded in serial fashion, whereby incremental adjustment (e.g., reduction) in the overall resistance may be achieved by sequentially applying such voltages across the diodes to selectively remove incremental resistances from the overall circuit. Such circuits are sometimes referred to as multi-bit trim circuits. For example, a series of such cells, each having a resistor connected in parallel with a zener diode, may be formed in an electrical device between two nodes of interest. An operational parameter associated with the device is measured, and a decision is made as to whether the device needs to be trimmed. If so, one of the diodes is blown, thereby shorting a corresponding one of the series resistors between the device nodes. The device is re-measured, and if further trimming or adjustment of the operating parameter is needed, the process repeats, with further diodes being blown so as to remove further resistance.

A conventional zener diode type trim cell 2 is illustrated in FIGS. 1A–1C, consisting of a resistor 4 and a zener diode 6 connected in parallel between two trim pads A and B. FIGS. 1A and 1C illustrate the trim cell 2 prior to the diode 6 being shorted, and FIG. 1B schematically illustrates the cell 2 after the diode has been sacrificially destroyed by application of a trim voltage across the pads A and B. The structural view of the trim cell 2 in FIG. 1C illustrates the layout of the pads A, B, the diode 6 and the resistor 4 in a portion of a typical electrical device semiconductor substrate 10, where the resistor 4 includes a resistor tank or portion 12 formed in the substrate 10. The tank 12 may be formed by selectively doping the tank portion 12 with a dopant which is different from the dopant type in the surrounding portions of the substrate 10. For instance, the tank 12 may be doped with P+ dopants where the surrounding substrate 10 is N type. Conductive contacts 14 and 16 are formed to electrically connect first and second ends of the tank 12 of the resistor 4 to the pads A and B, respectively.

The zener diode 6 consists of a similar tank region 18 doped with the same type dopant used in the resistor tank 12, and a second region 20 formed in the tank 18 by doping with a dopant of a different type. For example, the diode tank 18 is commonly doped with P type impurities while the second region 20 is doped with N type impurities. The edges of the second region 20 thus form a PN junction of the diode 6 at the interfaces between the P doped material of the tank 18 and the N type material in the second region 20. The N type doped material in the second region 20 (e.g., the cathode of the diode 6) is electrically connected to the pad B via an electrical contact 22, and the opposite end of the diode tank 18 (e.g., the anode) is connected to the pad A via a contact 24, wherein the contacts 14, 16, 22, 24 and the pads A, B are commonly formed in a metalization layer during fabrication of an electrical device (not shown) of which the trim cell 2 is a part.

In operation, the resistor 4 provides an electrical resistance between the pads A, B, which may be connected to nodes in a circuit (not shown). If it is determined that the electrical resistance needs to be removed, a voltage is applied (e.g., in either direction) across the pads A, B of sufficient level to cause heating of conductive metal near the second region 20 of the diode 6. For instance, where a DC voltage is applied with pad A held more negative than pad B, a field is established between the contact 22 at the second diode region 20 and the contact 24 at the opposite end of the diode tank 18. Conductive material (e.g., metal) from the contact 22 melts and spikes through the PN junction of the diode 6, and migrates through the tank 18 toward the contact 24, eventually shorting out the diode 6. This, in turn, short-circuits the resistor 4 in the resistor tank 12, whereby the electrical resistance of the resistor 4 is effectively removed from the circuit between the pads A and B, as illustrated schematically in FIG. 1B.

It is noted in FIG. 1C that the conventional trim cell 2 occupies a relatively large amount of area in the substrate 10. This is due at least in part to the separate tanks 12, 18 used to form the resistor 4 and the diode 6, respectively. As device densities continue to increase and device sizes and spacings continue to decrease in the design of modern semiconductor devices, the real estate in the substrate 10 becomes more and more costly. Accordingly, it is desirable to provide improved trim cell designs which take up less space in integrated circuits, while allowing the selective removal of electrical resistance therefrom.

Another shortcoming with conventional trim cell architectures is found where multiple cells 2 are configured in serial fashion to allow so-called multi-bit trimming. It is noted in FIG. 1A that the two pads A, B must be electrically accessed (e.g., probed) in order to remove the resistance of the resistor 4 (e.g., by blowing the diode 6) in the trim cell 2. Thus, where N such trim cells are configured in series, N+1 pads are needed to allow selective access for trimming the individual cells 2, each of which occupies a significant amount of surface area. Thus, it is also desirable to provide multi-bit trim cells occupying less overall real estate than the series configuration of multiple conventional trim cells such as that illustrated in FIGS. 1A–1C.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides single and multiple bit trim cells by which electrical resistance can be selectively removed from an electrical circuit in a controlled fashion without occupying excessive amounts of space in an electrical device. Trimming circuitry is provided comprising a resistor and a diode formed in the resistor body having a conductive portion selectively melted to short the resistor. The resistor may be formed in a bipolar process, such as during formation of bipolar transistor base structures, with the diode formed while constructing transistor emitter structures in the device. A multi-bit trim cell is also provided having two or more trim cells or circuits individually comprising a resistor with a diode formed in the resistor body for selectively shorting the resistor, and a fuse for selectively disconnecting the diode from a trim pad, wherein multiple trim cells may be trimmed using a single pair of trim pads. In addition, the invention provides methods and systems for trimming electrical devices to selectively remove resistance between two nodes in a device.

In accordance with one aspect of the invention, a trim circuit is provided, which comprises a resistor and a diode, the resistor providing an electrical resistance between first and second nodes in an electrical device. A first end of the resistor is connected to the first node and to a first pad in the electrical device. The diode comprises an anode, a cathode, and a conductive portion with the anode connected to the second end of the resistor, and the cathode connected to a second pad in the electrical device. Thus, the resistor and diode of the present invention are not connected in parallel, as was the case in the conventional trim cell 2 of FIG. 1A–1C above. Application of a trim voltage across the pads causes the conductive portion of the diode to electrically connect the ends of the resistor to thereby remove resistance between the first and second nodes.

In one implementation, the trim voltage causes melting of the conductive diode portion and spiking of conductive material through a PN junction of the diode formed in a resistor body, with the melted material being distributed or displaced along the length of the resistor body so as to short-circuit the resistor. The trim circuit may further comprise a fuse connected between the cathode and the second pad. A trim current may be applied between the pads to open circuit the fuse, thereby disconnecting the cathode from the second pad following short-circuiting of the resistor. In this manner, the application of the trim voltage removes electrical resistance between the first and second nodes, and application of the trim current disconnects the second pad from the first and second nodes.

According to another aspect of the invention, a multi-bit trim circuit is provided having two or more trim cells providing selectively removable resistances connected in series between two nodes in an electrical device. The trim circuit may be operated by application of signals to a single pair of terminals to selectively remove one or more of the series resistances. In this manner, the invention provides multi-bit trimming capabilities, which may be implemented to occupy less die area than was the case with conventional multi-bit trim circuits. In addition, the invention allows such multi-bit trimming via a single pair of pads. Thus, where such pads are accessible on a packaged device, the invention facilitates post-packaging trim operations.

This aspect provides multi-bit trim circuits comprising a first trim cell connected to a first node and to first and second pads in the electrical device, and at least a second trim cell connected between the first trim cell and the second node. The trim cells individually comprise a resistor with a resistor body and a diode formed in the resistor body. The resistor body extends in a substrate between first and second ends and provides an electrical resistance between the first and second nodes, where the diode comprises a conductive portion connecting a cathode to the second pad. Application of a trim voltage across the pads causes the conductive portion of the diode to connect the first and second ends of the resistor so as to remove resistance between the first and second nodes. The trim cells may further comprise a fuse connected between the cathode and the second pad, which selectively disconnects the cathode from the second pad after a trim current is applied between the first and second pads.

Other aspects of the invention provide systems and methods for trimming an electrical device to selectively remove resistance between two nodes in the device. The method comprises applying a trim voltage across first and second pads in the electrical device to short a first resistor in a first trim cell between the two nodes, and applying a trim current between the first and second pads to disconnect the first trim cell from the second pad. Thereafter a determination is made as to whether additional trimming is desired. If so, the application of the trim voltage and the trim current is repeated so as to remove further resistance between the two nodes.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1A:
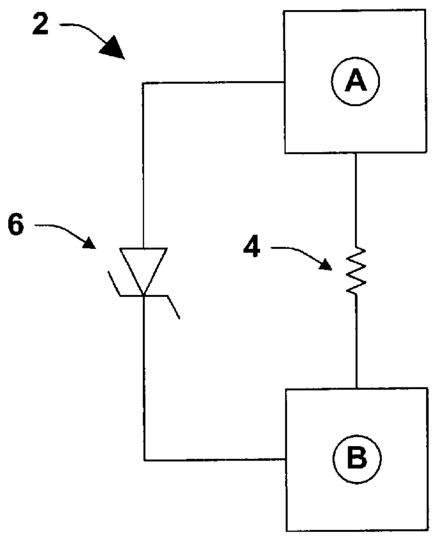
FIG. 1A (PRIOR ART)
FIG. 1A is a schematic diagram illustrating a conventional diode type trim cell having a resistor and a zener diode connected in parallel.
Figure 1B:
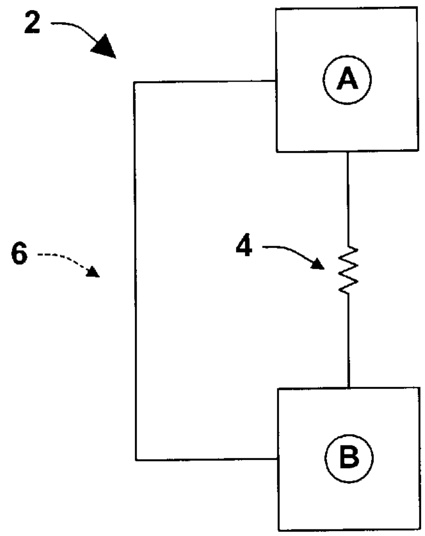
FIG. 1B (PRIOR ART)
FIG. 1B is a schematic diagram illustrating the trim cell of FIG. 1A after the diode has been sacrificially destroyed to short the resistor.
Figure 1C:
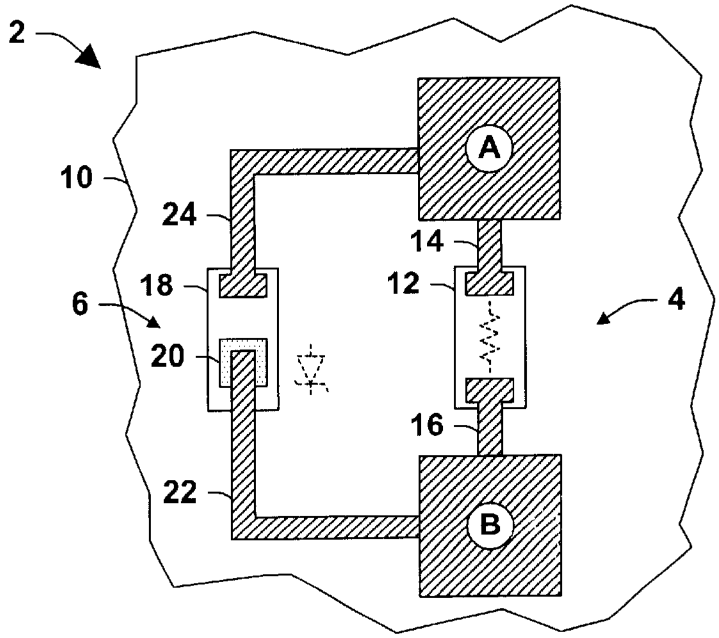
FIG. 1C (PRIOR ART)
FIG. 1C is a partial top elevation view illustrating the trim cell of FIGS. 1A and 1B.

The present invention will now be described with reference to the attached drawings, wherein like reference numerals are used to refer to like elements throughout. The invention relates to methods and apparatus for trimming electrical devices. Several exemplary implementations of the various aspects of the invention are illustrated and described below, including single-bit and multi-bit trim circuits and trim cells thereof. However, it will be appreciated that the illustrated implementations are exemplary in nature and that the invention and the appended claims are not limited to the examples specifically illustrated and described herein.

Figure 2A:
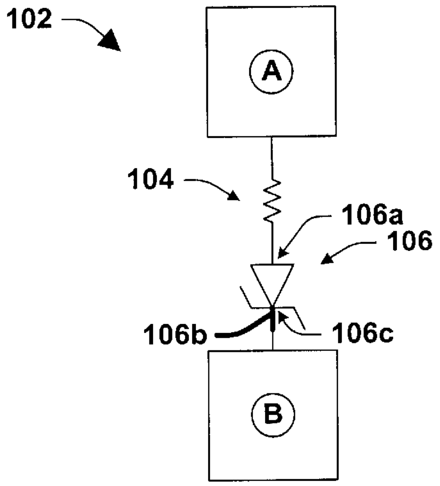
FIG. 2A is a schematic diagram illustrating an exemplary single bit trim circuit in accordance with the present invention.
Figure 2B:
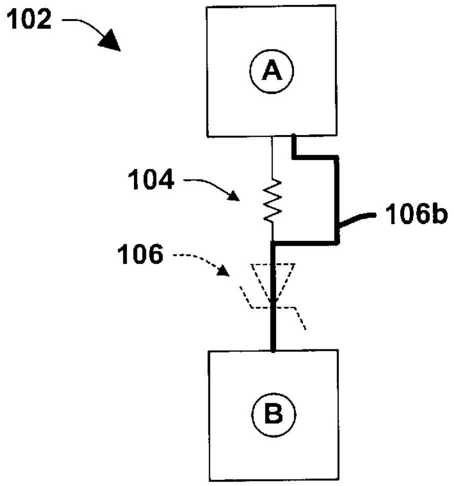
FIG. 2B is a schematic diagram illustrating the trim circuit of FIG. 2A following destruction of the diode to short the resistor.

Referring initially to FIGS. 2A and 2B, one implementation of the invention is illustrated schematically, wherein a trim circuit 102 comprises a resistor 104 and a zener diode 106, with the resistor 104 initially providing an electrical resistance between first and second pads A and B at first and second ends thereof. FIG. 2A illustrates the initial condition of the circuit 102 and FIG. 2B illustrates a final condition of the circuit 102 following destruction of the diode 106 to short-circuit the resistor 104.

The pads A and B may be connected to first and second circuit nodes in an electrical device (not shown) of which the trim circuit 102 is a part, wherein adjustment in the electrical resistance between the nodes may be desired. For example, the trim circuit 102 and other trim circuits and cells illustrated and described hereinafter may be employed for selective removal of resistance between two circuit nodes to provide adjustment of an operating parameter associated with such electrical devices. Thus, for instance, a reference voltage may be advantageously adjusted in a voltage regulator device using the circuits and methods of the present invention by selective removal of all or a portion of electrical resistance between two nodes in the device.

In accordance with the invention, the diode 106 comprises an anode 106*a*, a cathode 106*c*, and a conductive portion 106*b* connected to the cathode 106*c*, although other implementations are possible wherein a conductive portion is connected to the anode 106*a*. The anode 106*a* is connected to a second end of the resistor 104, and the cathode 106*c* is connected to the second pad B. The conductive portion 106*b* of the diode 106 operates to connect the first and second ends of the resistor 104 (e.g., to short-circuit the resistor 104) so as to remove resistance in the electrical device, by application of a trim voltage across the trim pads A and B.

As illustrated and described in greater detail below, the conductive portion 106*b* may comprise a conductive metal contact structure, such as aluminum, formed over a diode body portion in a resistor body region of the resistor 104. In this case, application of the trim voltage melts the conductive contact material 106*b*, which is spiked through the PN junction of the diode 106 and distributed along the length of the resistor 104, thereby short-circuiting the resistor 104 as illustrated schematically in FIG. 2B.

Figure 2C:
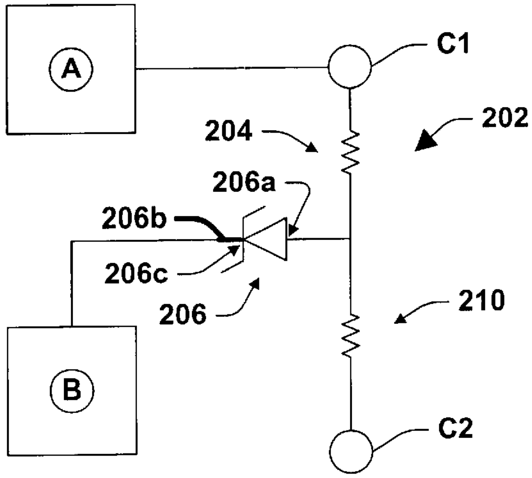
FIG. 2C is a schematic diagram illustrating another exemplary single bit trim circuit in accordance with the invention.
Figure 2D:
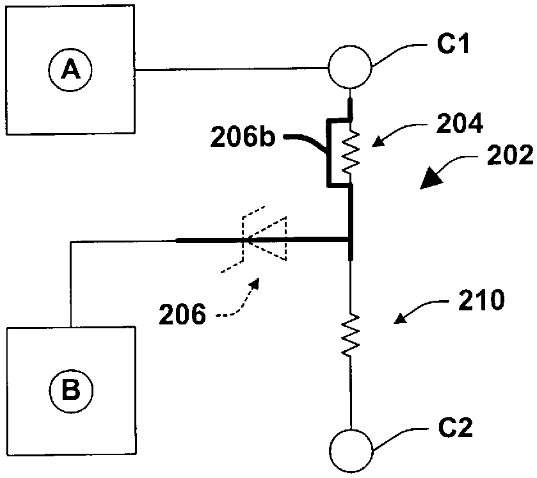
FIG. 2D is a schematic diagram illustrating the trim circuit of FIG. 2C following destruction of the diode to short the resistor thereof.

An alternate implementation of the invention is illustrated schematically in FIGS. 2C and 2D, wherein a trim circuit or cell 202 comprises a resistor 204 providing electrical resistance between circuit nodes C1 and C2 with a trim pad A connected to a first end of the resistor 204, and a diode 206 connected between a second end of the resistor 204 and a second pad B. A fixed resistor 210 is optionally provided between the second end of the resistor 204 and the second node C2. Initially, the total resistance between the circuit nodes C1 and C2 is the sum of the trim resistor 204 and the fixed resistor 210 as illustrated in FIG. 2C. Subsequent trimming provides for selective removal (e.g., short-circuiting) of the trim resistor 204 to effectively remove a portion of the resistance between the nodes C1 and C2, as illustrated in FIG. 2D.

The diode 206 comprises an anode 206*a*, a cathode 206*c*, and a conductive portion 206*b* connected between the cathode 206*c* and the second pad B, wherein the anode 206*a* is connected to the second end of the resistor 204 and the fixed resistor 210. As with the trim circuit 102 of FIGS. 2A and 2B, the conductive portion 206*b* connects the first and second ends of the resistor 204 so as to remove resistance between the nodes C1 and C2 after a trim voltage is applied across the pads A, B.

Figure 3A:
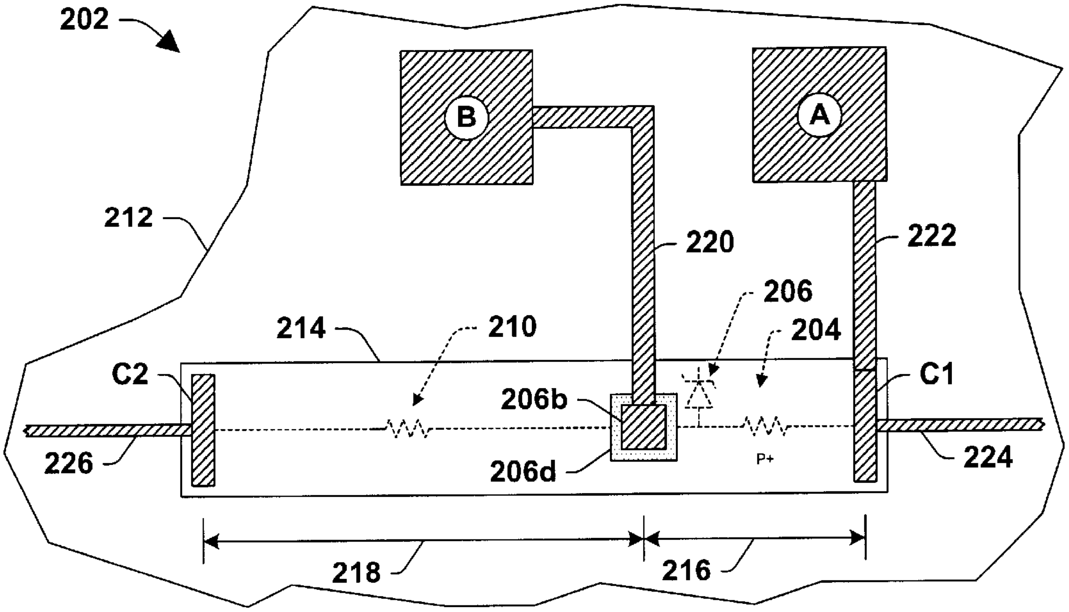
FIG. 3A is a partial top elevation view illustrating an exemplary implementation of the trim circuit of FIG. 2C prior to destroying the diode.
Figure 3B:
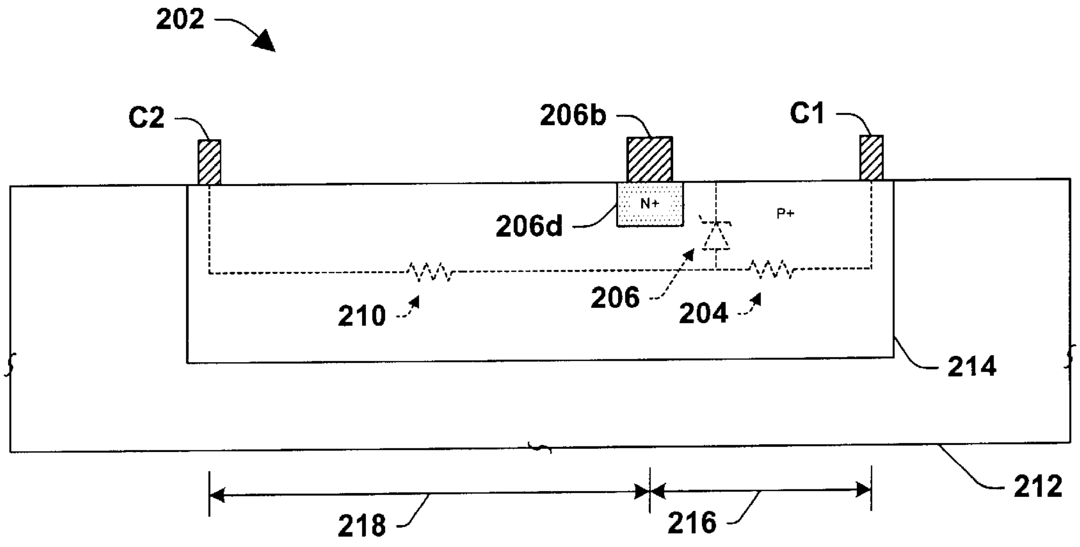
FIG. 3B is a partial side elevation view in section illustrating the trim circuit of FIG. 3A prior to destroying the diode.

Referring now to FIGS. 2C, 3A, and 3B, the trim circuit 202 may be fabricated in a semiconductor substrate 212, such as silicon, wherein the resistor 204 comprises a resistor body 214 extending in the substrate 212 along a length 216 between the first and second ends of the resistor 204. A separate resistor body (not shown) may be formed in the substrate 212 for the fixed resistor 210. However, in the illustrated implementation, a single (e.g., composite) resistor body 214 is employed for both the trim resistor 204 and the fixed resistor 210, which extends the trim resistor length 216 plus an additional length 218 in the substrate 212.

The substrate 212 surrounding the resistor body 214 is doped with N type impurities, such as in an N-well of the electrical device, and the resistor body 214 is doped with a P+ type dopant. The diode 206 comprises a diode body portion **206*d* in the resistor body 214 near the second end of the trim resistor 204, where the diode body portion 206*d* is doped with N+ type dopants to form a P/N junction at the interface between the N+ type diode body portion 206*d* and the surrounding P+ type resistor body 214. In one implementation, the resistor 204 may advantageously be formed in a bipolar process as a base structure, with the diode 206** being formed as a bipolar transistor emitter.

The circuit nodes C1 and C2 are connected to the resistor body 214 in the form of metal layer contact structures C1 and C2, and the conductive portion **206*b* of the diode 206 comprises a conductive contact structure 206*b* formed over the diode body portion 206*d*, as illustrated in FIGS. 3A and 3B. The conductive contact structure 206*b* is connected to the trim pad B via a conductive line 220 and the first end of the resistor 204 (e.g., at node C1) is connected to the first pad A via a conductive line 222. The nodes C1 and C2 are connected to other components in an electrical device (not shown) via conductive lines 224 and 226**, respectively.

Figure 4A:
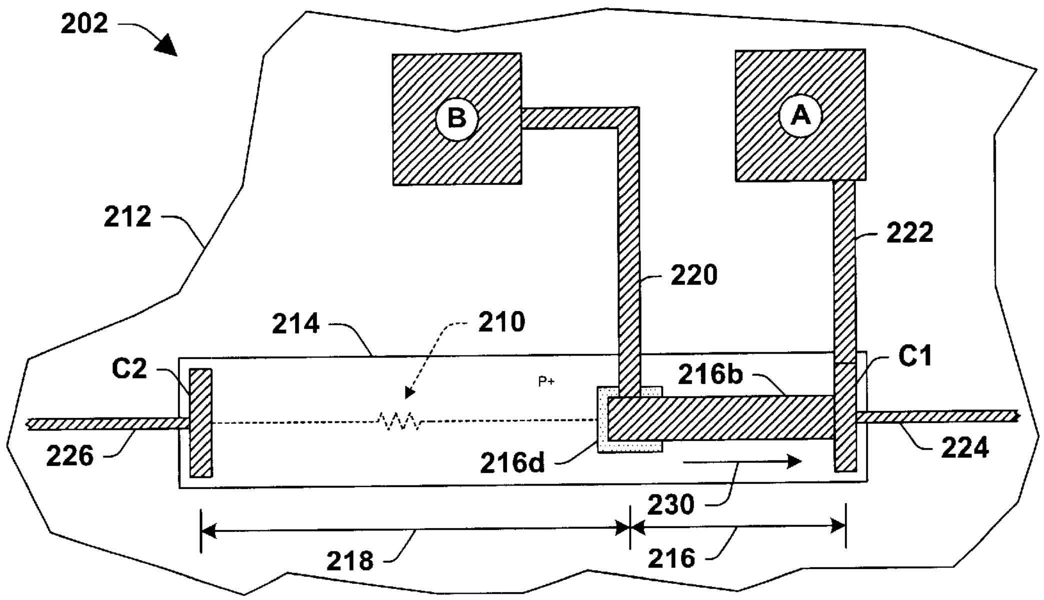
FIG. 4A is a partial top elevation view illustrating the trim circuit of FIGS. 3A and 3B following destruction of the diode.
Figure 4B:
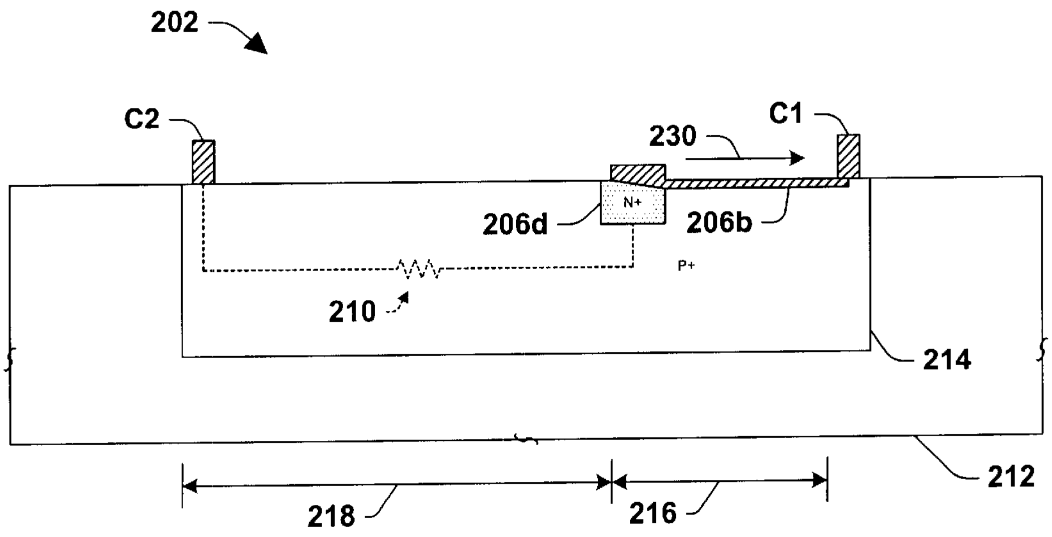
FIG. 4B is a partial side elevation view in section illustrating the trim circuit of FIG. 4A following destruction of the diode.

Referring now to FIGS. 2D, 4A, and 4B, the trim pads A and B of the trim circuit 202 may be probed by a tester or other trimming system (e.g., FIG. 7B below) in order to apply a trim voltage across the pads A and B for selective removal of resistance between the nodes C1 and C2. Application of the trim voltage across pads A and B melts the conductive contact structure **206*b* of the diode 206 and distributes conductive material therefrom along the resistor body 214 between the ends of the resistor 204 in the direction of arrow 230 to connect the first and second ends of the resistor 204. This effectively removes resistance along the length 216 of the trim resistor 204 in the resistor body 214**.

The trim voltage may be applied in either polarity across the trim pads A, B. However, in the illustrated implementations described hereinafter, the trim voltage is applied with pad B more positive than pad A, whereby the conductive material from the conductive portion **206*b* is distributed between the diode 206 and the contact C1 in the direction of the resulting electric field as shown by the arrow 230. As a result, the total resistance between the circuit nodes C1 and C2 is reduced to that of the fixed resistor 210 via the sacrificial destruction of the diode 206**.

Figure 5:
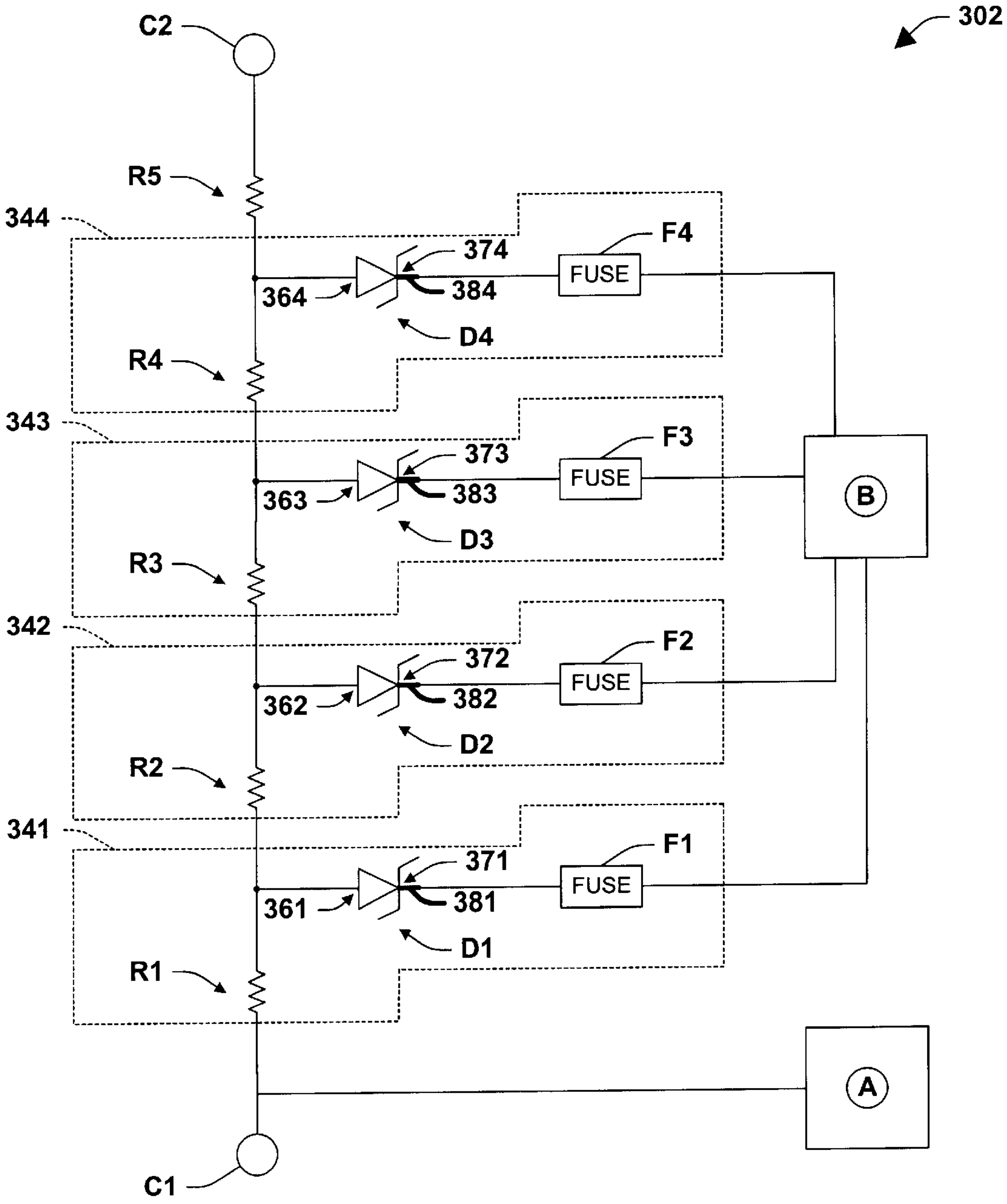
FIG. 5 is a schematic diagram illustrating an exemplary multi-bit trim circuit in accordance with another aspect of the present invention.
Figure 6A:
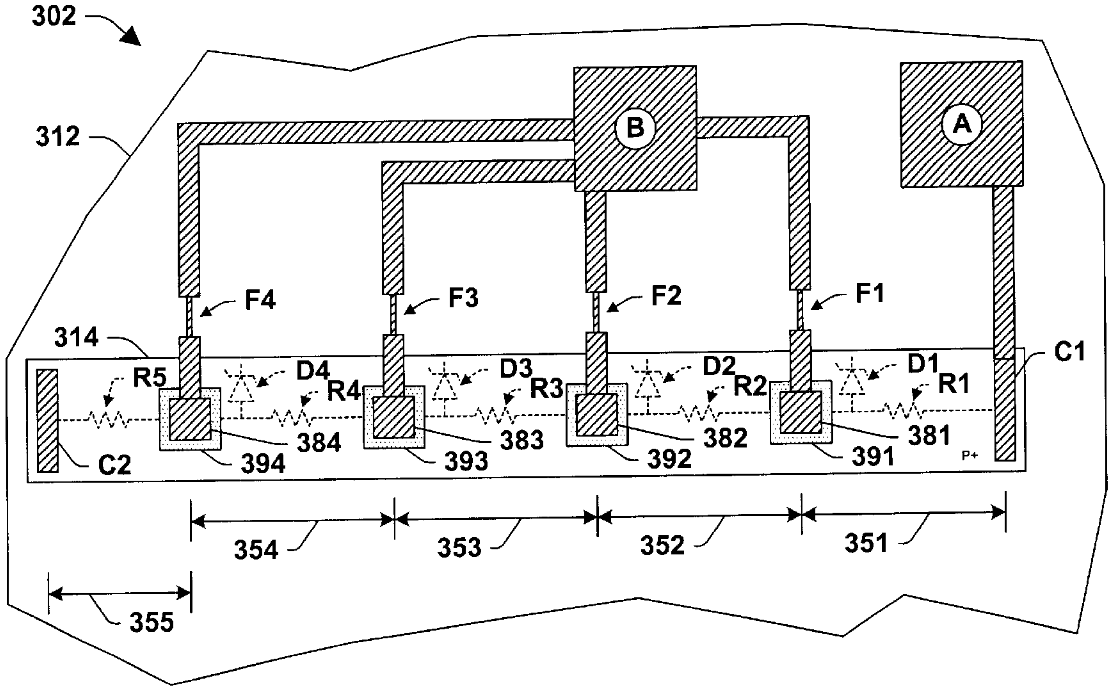
FIGS. 6A and 6B are partial top plan and side elevation views illustrating one implementation of the multi-bit trim circuit of FIG. 5.
Figure 6B:
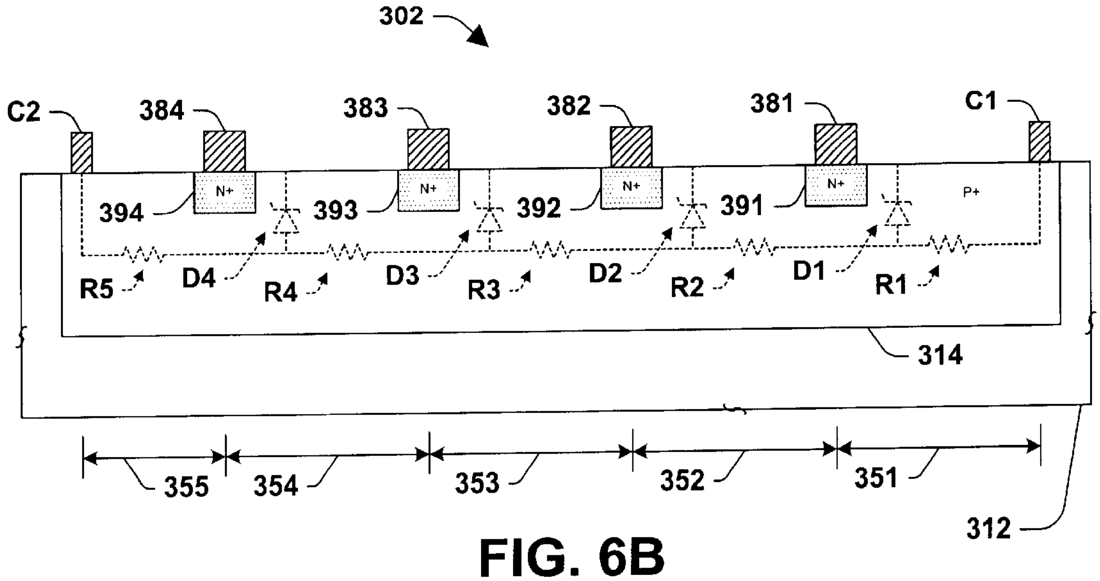

Another aspect of the present invention relates to multi-bit trim circuits. An exemplary trim circuit 302 is illustrated and described hereinafter with respect to FIGS. 5–9B, which comprises two or more trim cells 341–344 connected to provide individual selectively removable resistances in series between first and second circuit nodes C1 and C2 in an electrical device. While the exemplary trim circuit 302 comprises four such trim cells 341–344, any number of two or more such cells are contemplated within the scope of the invention. The incremental removal of resistance in the trim circuit 302 is accomplished as illustrated in the following figures, through application of appropriate trim voltages and currents to first and second trim pads A and B. The initial state of the trim circuit 302 is illustrated in FIGS. 5, 6A, and 6B prior to trimming operations.

The exemplary trim circuit 302 comprises four trim cells 341–344, individually comprising resistors R1–R4, zener diodes D1–D4, and fuses F1–F4, respectively, wherein the trim cell resistors R1–R4 are serially connected with a fixed resistor R5 between the nodes C1 and C2. The first node C1 is connected to the first trim pad A and the fuses F1–F4 initially connect the trim cells 341–344 to the second trim pad B, respectively. In the circuit 302, the fuses F1–F4 provide temporary conductive paths through the cells 341–344 to allow application of trim voltages thereto in order to selectively short-circuit one or more of the cell resistors R1–R4 on an as needed basis to achieve a desired final resistance between the circuit nodes C1 and C2, as described in greater detail hereinafter.

The trim cell resistors R1–R4, as well as the fixed resistor R5 are formed in a common P type doped resistor body 314 extending in an N type doped substrate 312 along corresponding lengths 351–355, respectively, wherein electrical resistances of the resistor body 314 along the lengths 351–355 contribute to the total initial resistance between the circuit nodes C1 and C2 prior to trimming. Alternatively, the trim resistors R1–R4 and/or the fixed resistor R5 may individual comprise separate resistor bodies (not shown) in the substrate 312.

The trim cell zener diodes D1–D4 are formed in the composite resistor body 314, comprising anodes 361–364, cathodes 371–374, and conductive portions 381–384 connected to the cathodes 371–374, respectively. As illustrated in FIGS. 6A and 6B, the diodes D1–D4 comprise diode body portions 391–394, respectively, which comprise N+ doped regions in the resistor body 314, wherein the conductive portions 381–384 comprise conductive contact structures 381–384 formed over the diode body portions 391–394, respectively. The contact structures 381–384 are connected to the second trim pad B through the fuses F1–F4.

Figure 7A:
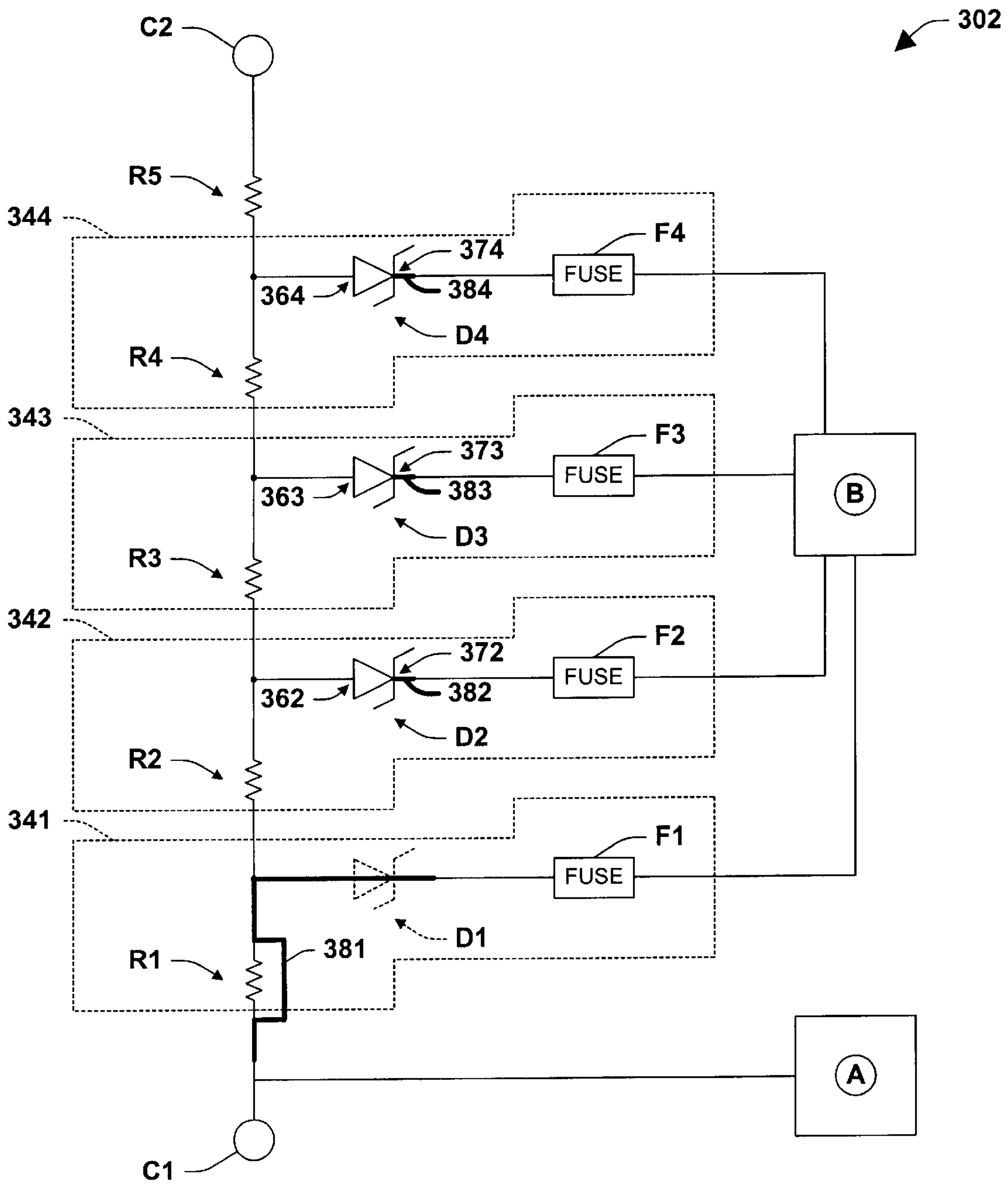
FIG. 7A is a schematic diagram illustrating the trim circuit of FIG. 5 with a first diode destroyed to short a first resistor.
Figure 7B:
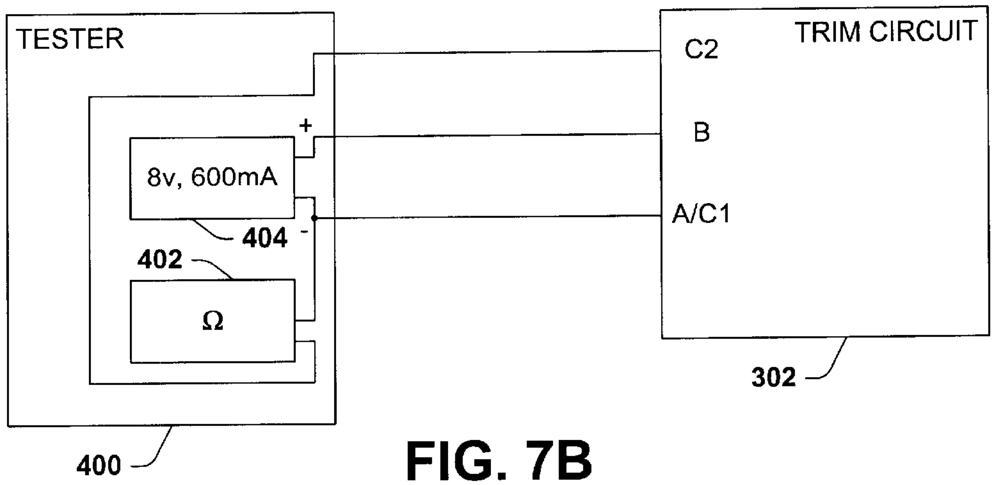
FIG. 7B is a schematic diagram illustrating an exemplary system for trimming an electrical device providing a trim voltage to destroy the first diode in the trim circuit of FIG. 7A.
Figure 7C:
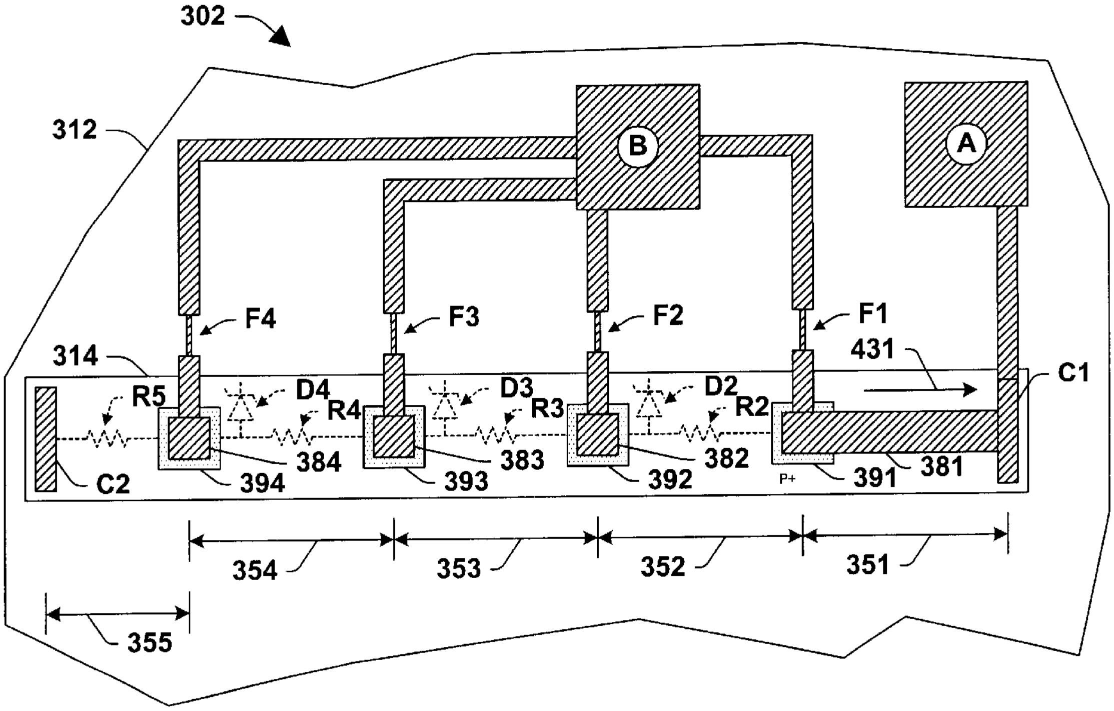
FIG. 7C is a partial top plan view illustrating the trim circuit of FIG. 7A with the first diode destroyed.
Figure 7D:
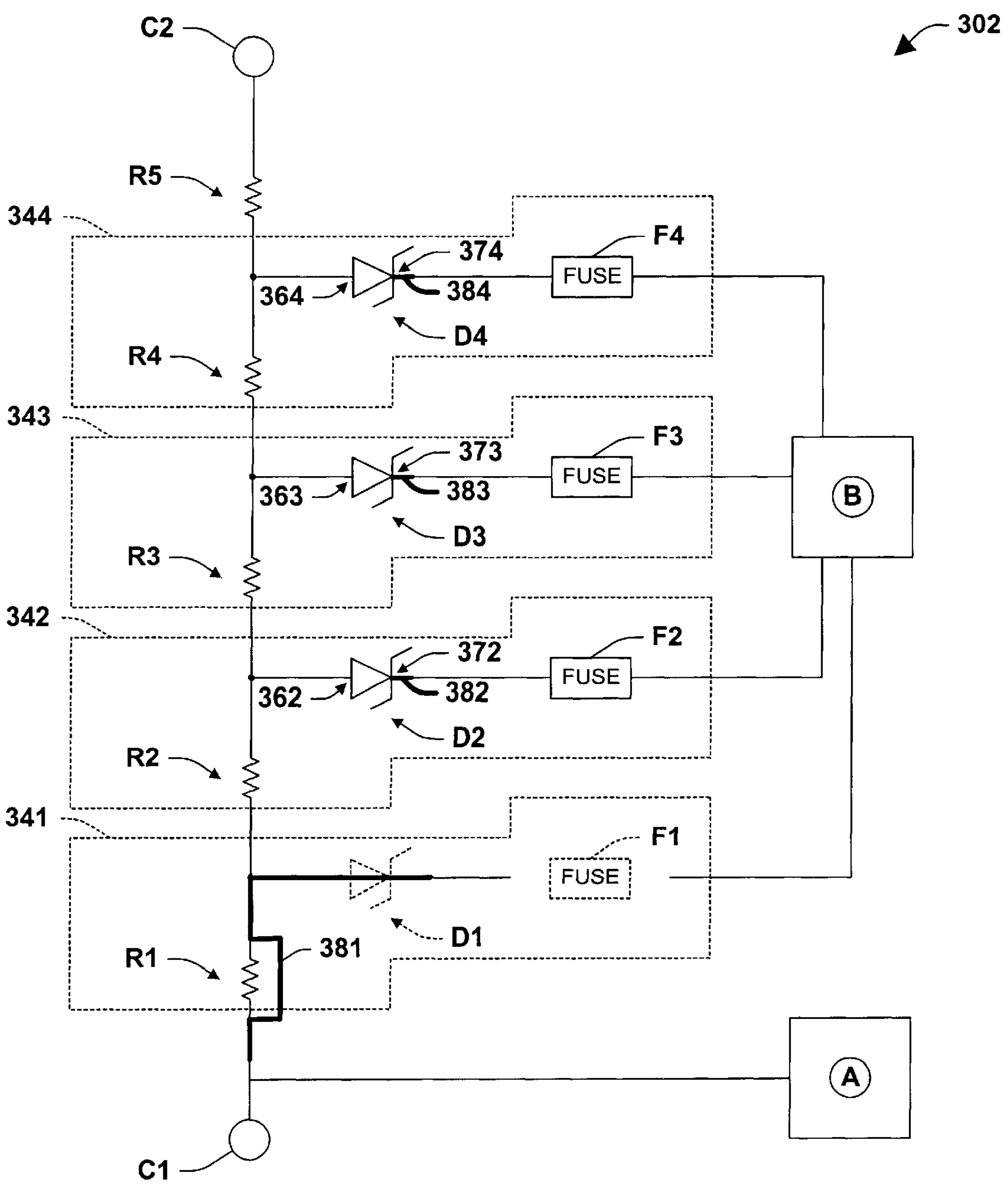
FIG. 7D is a schematic diagram illustrating the trim circuit of FIG. 7A with a first fuse destroyed to disconnect a first trim cell from the second trim pad.
Figure 7E:
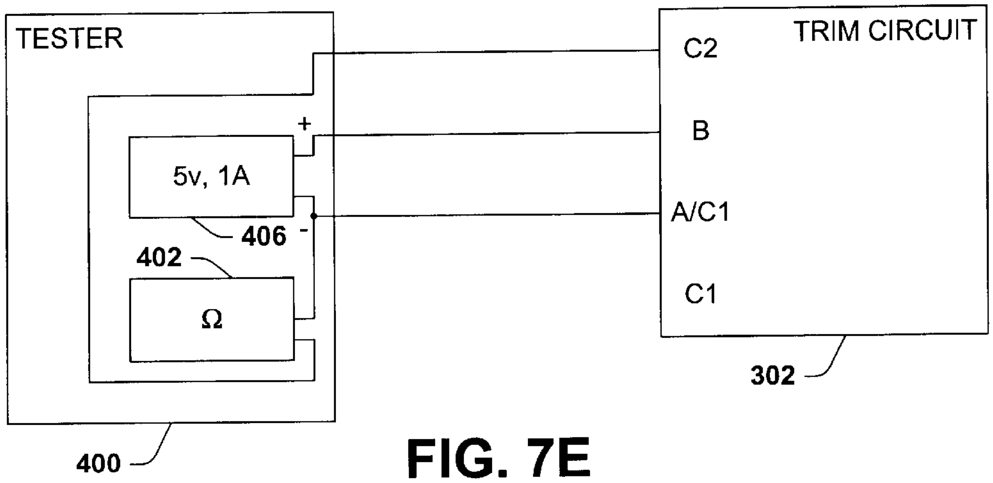
FIG. 7E is a schematic diagram illustrating the system of FIG. 7B configured to provide a trim current to destroy the first fuse in the trim circuit of FIG. 7D.
Figure 7F:
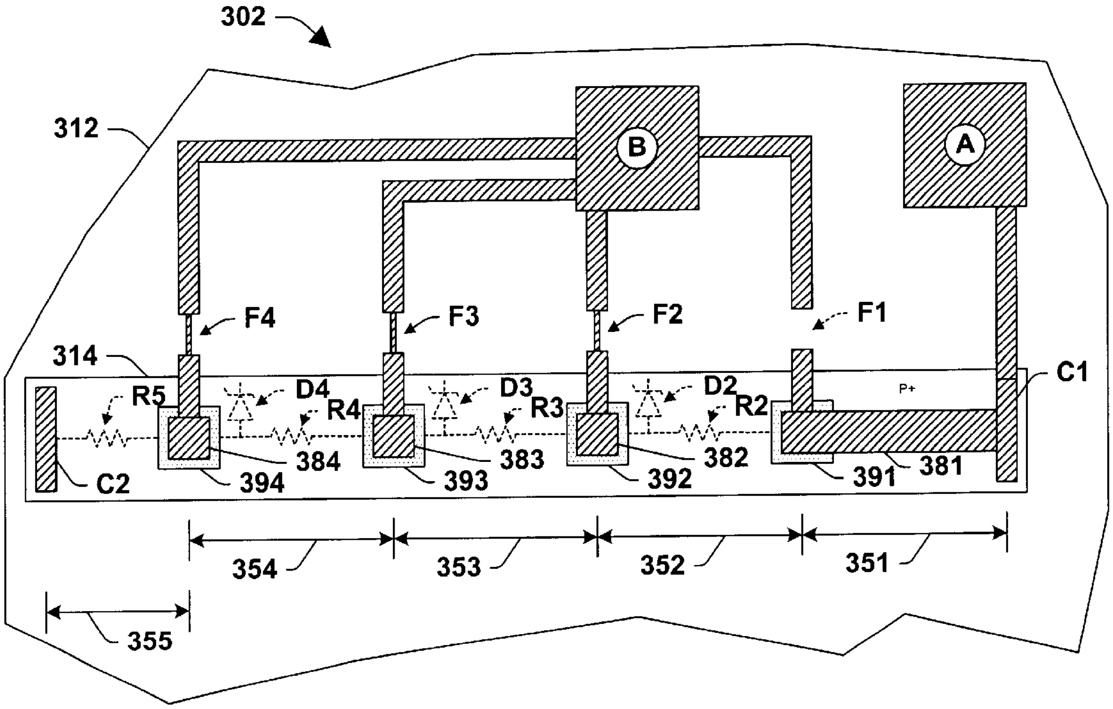
FIG. 7F is a partial top plan view illustrating the trim circuit of FIG. 7D with the first fuse destroyed.

In operation, the trim circuit 302 may be used to adjust the total resistance between the nodes C1 and C2 through selective application of trim voltages across the trim cell diodes D1–D4 and trim currents through the trim cell fuses F1–F4 so as to incrementally remove the resistance of the trim cells 341–344, beginning with the cell 341 closest to the first trim pad A, as illustrated and described hereinafter with respect to FIGS. 7A–9B. Initially, a determination is made as to whether any trimming is required, and if so, the first cell 341 is trimmed, as illustrated in FIGS. 7A–7F. FIGS. 7A–7C illustrate removal (short-circuiting) of the first cell resistor R1 through application of a trim voltage of about 8 volts at about 600 mA across the pads A, B with pad B being held more positive than pad A. FIGS. 7D–7F illustrate subsequent disconnection of the first trim cell 341 from the second trim pad B through application of a trim current of about 1A through the cell 341 to blow (e.g., open circuit) the fuse F1.

FIG. 7B illustrates an exemplary tester 400, which may be employed to trim the trim circuit 302 in accordance with the invention, comprising appropriate electrical probes and connections to contact the circuit nodes C1 and C2, and the trim pads A and B. The tester 400 makes an initial determination of whether the total resistance between the circuit nodes C1 and C2 is greater than a desired resistance value, such as by connection of an impedance sensor 402 to the contacts C1 and C2. Other test configurations and procedures are contemplated for determining whether trimming is desired, for example, such as measuring one or more voltages, currents, or other operating parameters associated with an electrical device in which the trim circuit 302 is employed, which may be adjusted by changing (e.g., reducing) the resistance between C1 and C2. In one example, the trim circuit 302 may be part of a voltage regulator device, wherein a voltage reference value is adjustable through trimming the resistance between an output pad B and an adjust or ground pad A.

If trimming is needed, the tester 400 applies a trim voltage 404, such as about 8 volts DC across the pads A, B (e.g., with B more positive than A), at a current of about 600 mA. This provides energy to the first zener diode D1 through a circuit consisting of resistor R1, diode D1, and fuse F1, which operates to melt the conductive material of the contact 381 of the first trim cell 341. The contact material 381 spikes through the PN junction of the diode D1 and is distributed along the length 351 of the first resistor R1 in the composite resistor body 314 in the direction of the resulting electric field, as indicated by the arrow 431 in FIG. 7C.

The diode D1 is destroyed in the process, and additionally, the first resistor R1 is effectively short-circuited (e.g., removed from the electrical path between circuit nodes C1 and C2) as a result of the melting and redistribution of conductive material from the conductive portion 381 of the former diode D1. At this point, it is noted that the fuse F1 is sized to accommodate the current (e.g., about 600 mA) associated with application of the trim voltage 404 without blowing (e.g., fuse F1 remains intact during application of the trim voltage 404). With the resistor R1 and diode D1 effectively removed from the circuit 302, the total resistance between the circuit nodes C1 and C2 is the sum of the remaining trim resistors R2–R4 and the fixed resistor R5.

Depending upon the circuit configuration of the electrical device of which the trim circuit 302 is a part, the trimming operation may be complete at this point, if the total remaining resistance is less than or equal to the desired resistance (e.g., or if the operational parameter of interest is within a desired range, etc.). However, the circuit as illustrated in FIGS. 7A and 7C includes a short-circuit between node C1 (e.g., and pad A) and the second trim pad B, through the first fuse F1. If this short-circuit is undesirable, or if further trimming is desired, the fuse F1 may be removed (e.g., open circuited) as illustrated in FIGS. 7D–7F.

As illustrated in FIG. 7E, the tester 400 provides a trim current 406 between the pads A, B of the trim circuit 302, such as about 1A, to blow or destroy the first fuse F1. It is noted at this point, that the application of the trim current 406 provides enough current to blow the fuse F1, but not enough energy to melt the diode D2 of the second trim cell 342. As a result, the circuit 302 thereafter appears as illustrated in FIGS. 7D and 7F, wherein the fuse F1 is open circuited and the resistor R1 is short-circuited. At this point, the resistance between nodes C1 and C2 is still the sum of resistors R2–R5, but the path of least resistance between the trim pads A and B is through the second trim cell 342 (e.g., the closest remaining trim cell to the first pad A).

Figure 8A:
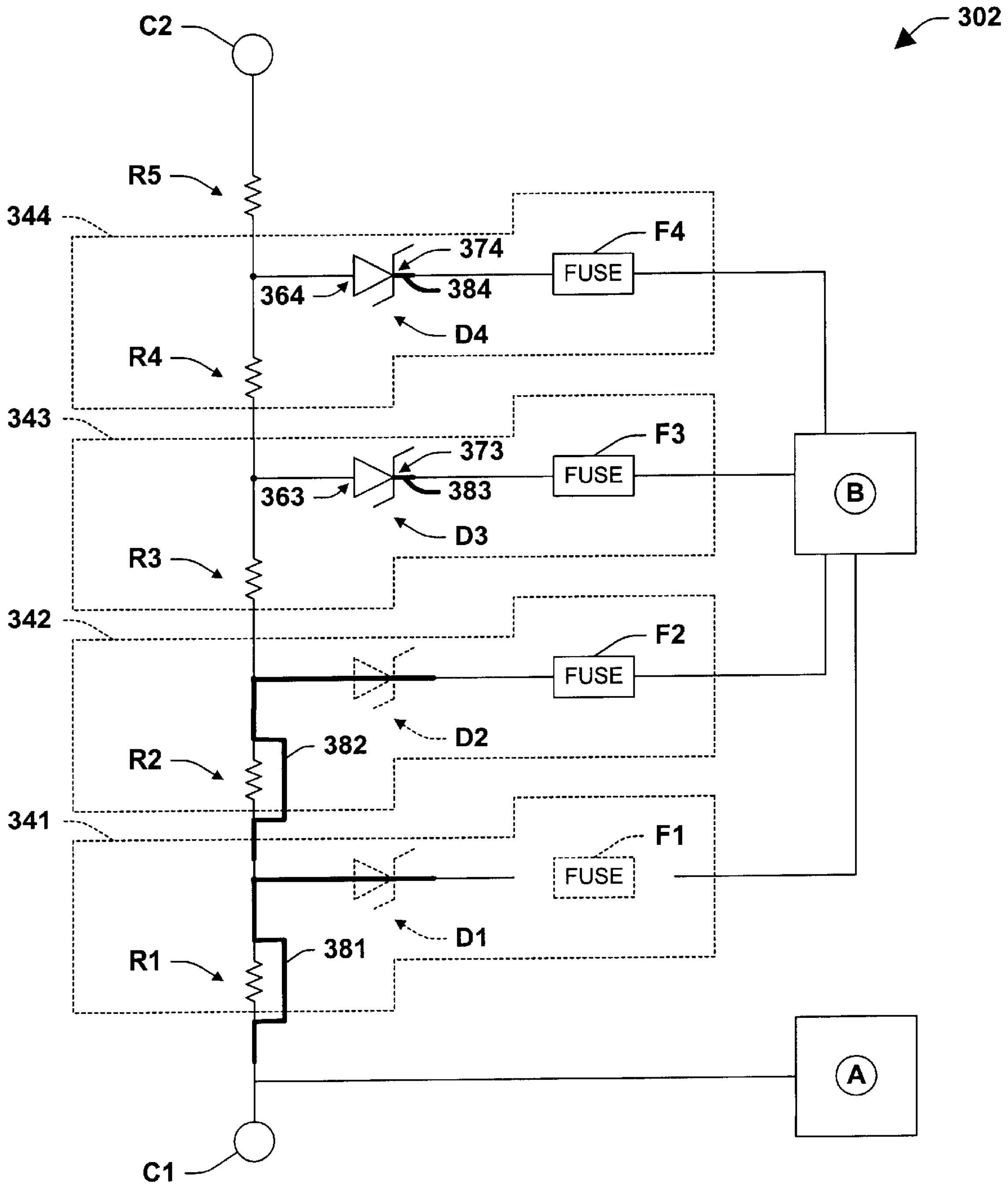
FIG. 8A is a schematic diagram illustrating the trim circuit of FIG. 7D with a second diode destroyed to short a second resistor.
Figure 8B:
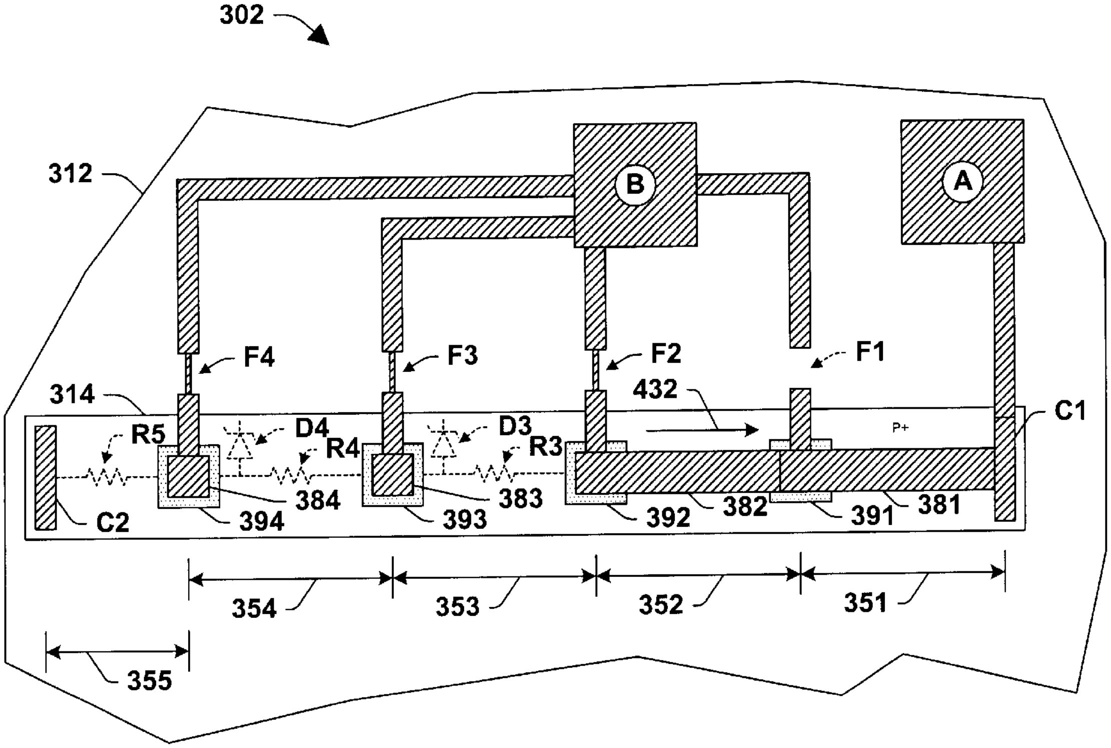
FIG. 8B is a partial top plan view illustrating the trim circuit of FIG. 7F with the second diode destroyed to short the second resistor.

Thereafter, a determination is again made as to whether further trimming is required in the circuit 302. If so, the resistance R2 of the next cell 342 is removed, as illustrated in FIGS. 8A–8D, wherein the operation of the tester 400 is similar to that described above with respect to FIGS. 7B and 7E in providing trim voltages and currents 404 and 406, respectively, to the trim circuit 302. In FIGS. 8A and 8B, a trim voltage 404 (FIG. 7B) is again applied between the pads A and B (e.g., B more positive than A), this time to melt the conductive portion 382 of the second trim cell 342, thereby shorting the second trim resistor R2. In this regard, the shorting of the second resistor R2 is similar in nature to that described above for the first resistor R1 and diode D1.

Figure 8C:
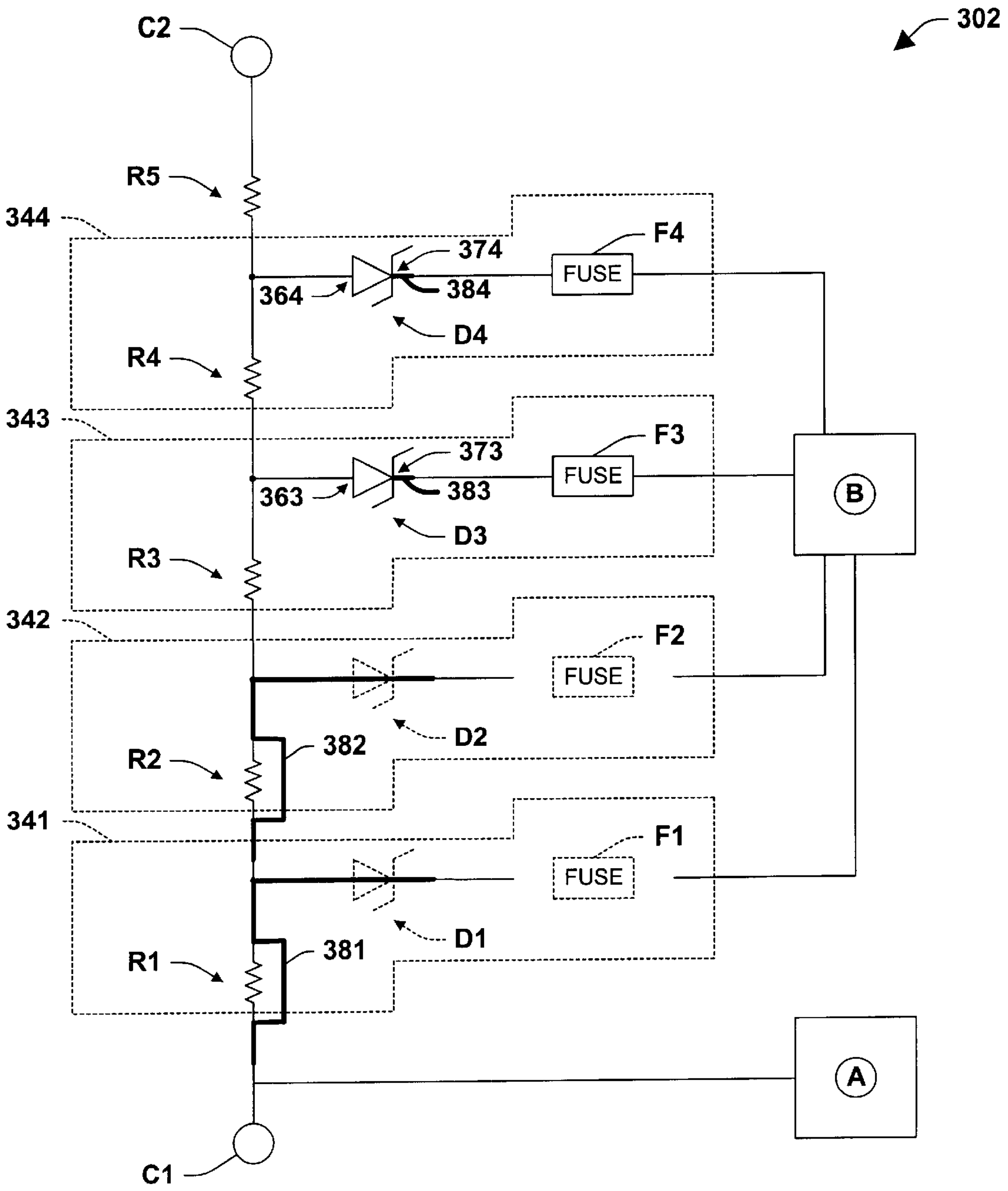
FIG. 8C is a schematic diagram illustrating the trim circuit of FIG. 8A with a second fuse destroyed to disconnect a second trim circuit from the second trim pad.
Figure 8D:
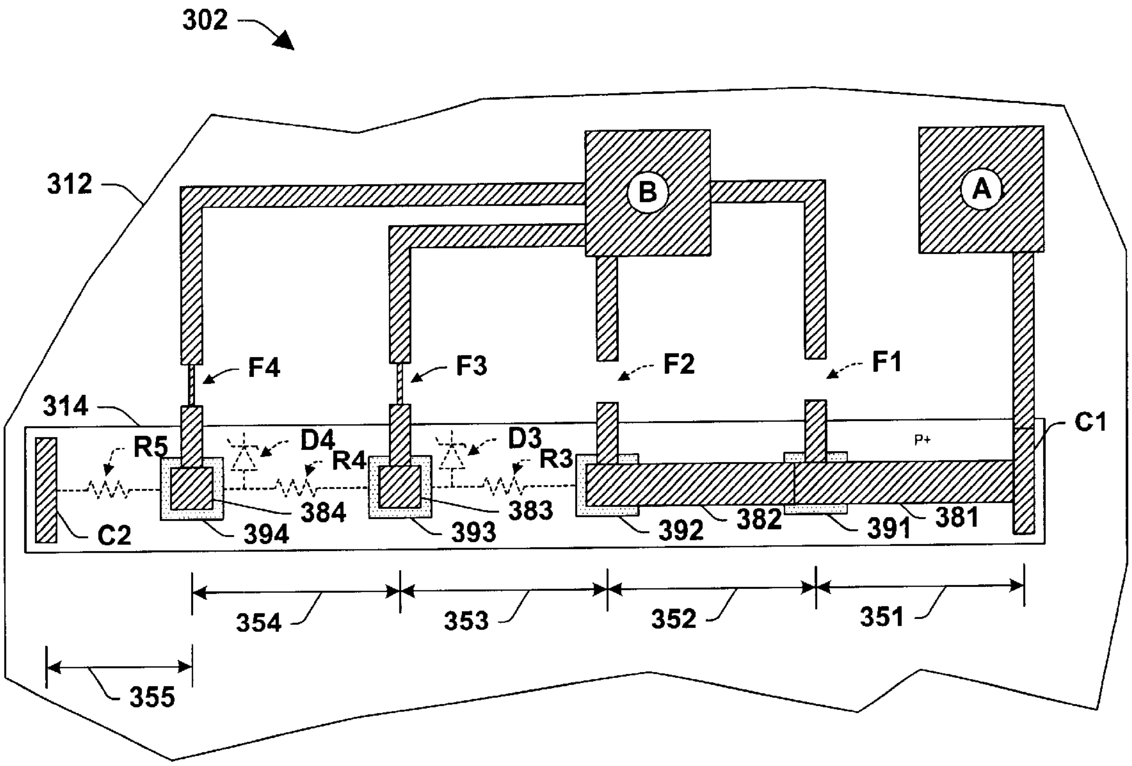
FIG. 8D is a partial top plan view illustrating the trim circuit of FIG. 8B with the second fuse destroyed.

Conductive material from the conductive contact 382 is heated by application of the trim voltage, causing spiking through the PN junction of the diode D2 and migration of conductive material 382 in the direction of arrow 432 in FIG. 8B along the length 352 of the resistor body 314 corresponding to the resistor R2. This effectively removes R2 from the circuit 302, by which the total resistance between nodes C1 and C2 is now reduced to the sum of resistors R3–R5. Thereafter, as illustrated in FIGS. 8C and 8D, the tester 400 applies the trim current 406 (FIG. 7E) between the pads A and B, thereby destroying the second cell fuse F2 and disconnecting the cell 342 from the second pad B.

Figure 9A:
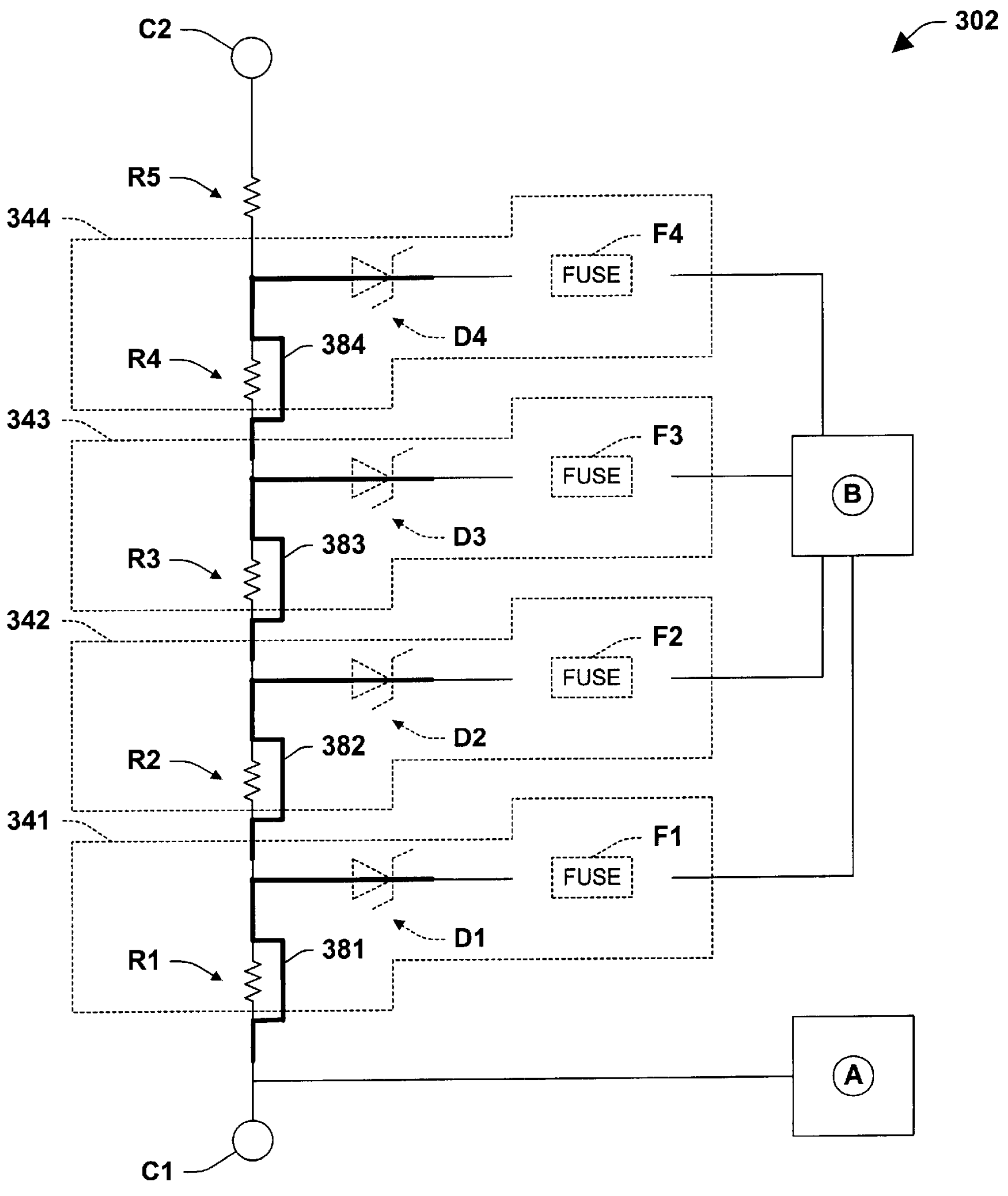
FIG. 9A is a schematic diagram illustrating the trim circuit with diodes and fuses of third and fourth trim cells destroyed to remove third and fourth resistances from the trim circuit.
Figure 9B:
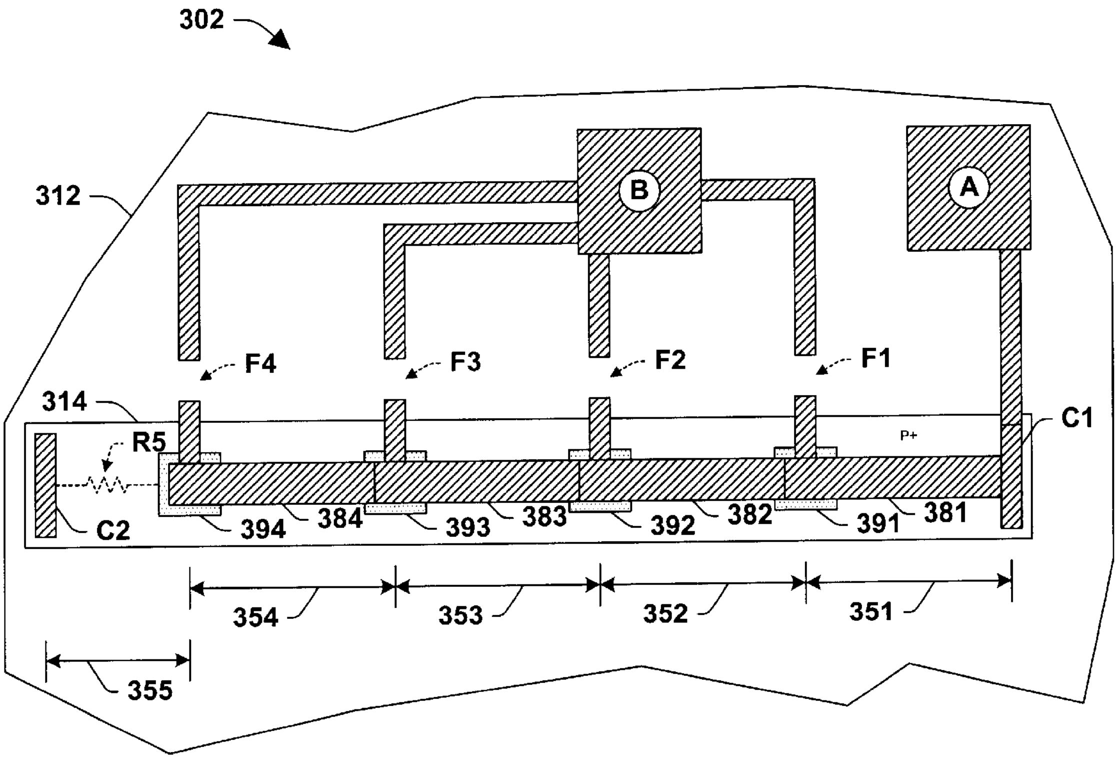
FIG. 9B is a partial top plan view illustrating the trim circuit of FIG. 9A with the third and fourth resistances removed.

This process is continued until the desired total resistance is achieved between the circuit nodes C1 and C2. Thus, none, some, or all of the trim cells 341–344 may be incrementally removed from the trim circuit 302, wherein the latter case is illustrated in FIGS. 9A and 9B. As illustrated, the resulting circuit 302 has all of the trim resistors R1–R4 effectively short-circuited by melting of the conductive portions 381–384 of the diodes D1–D4 in the trim cells 341–344, respectively, which is accomplished through four applications of the trim voltage 404 across the pads A and B, with intervening applications of the trim current 406 therebetween to blow the fuses F1–F4. The resulting circuit 302 in FIGS. 9A and 9B thus provides a total resistance between the nodes C1 and C2 roughly equal to the fixed resistor R5. It is noted at this point, that the shorting of the trim resistors R1–R4 effectively removes most if not all of the corresponding electrical resistances associated therewith, although some residual resistance may remain, wherein the resistance between C1 and C2 in FIGS. 9A and 9B may be the sum of R5 and such residual resistances.

Figure 10:
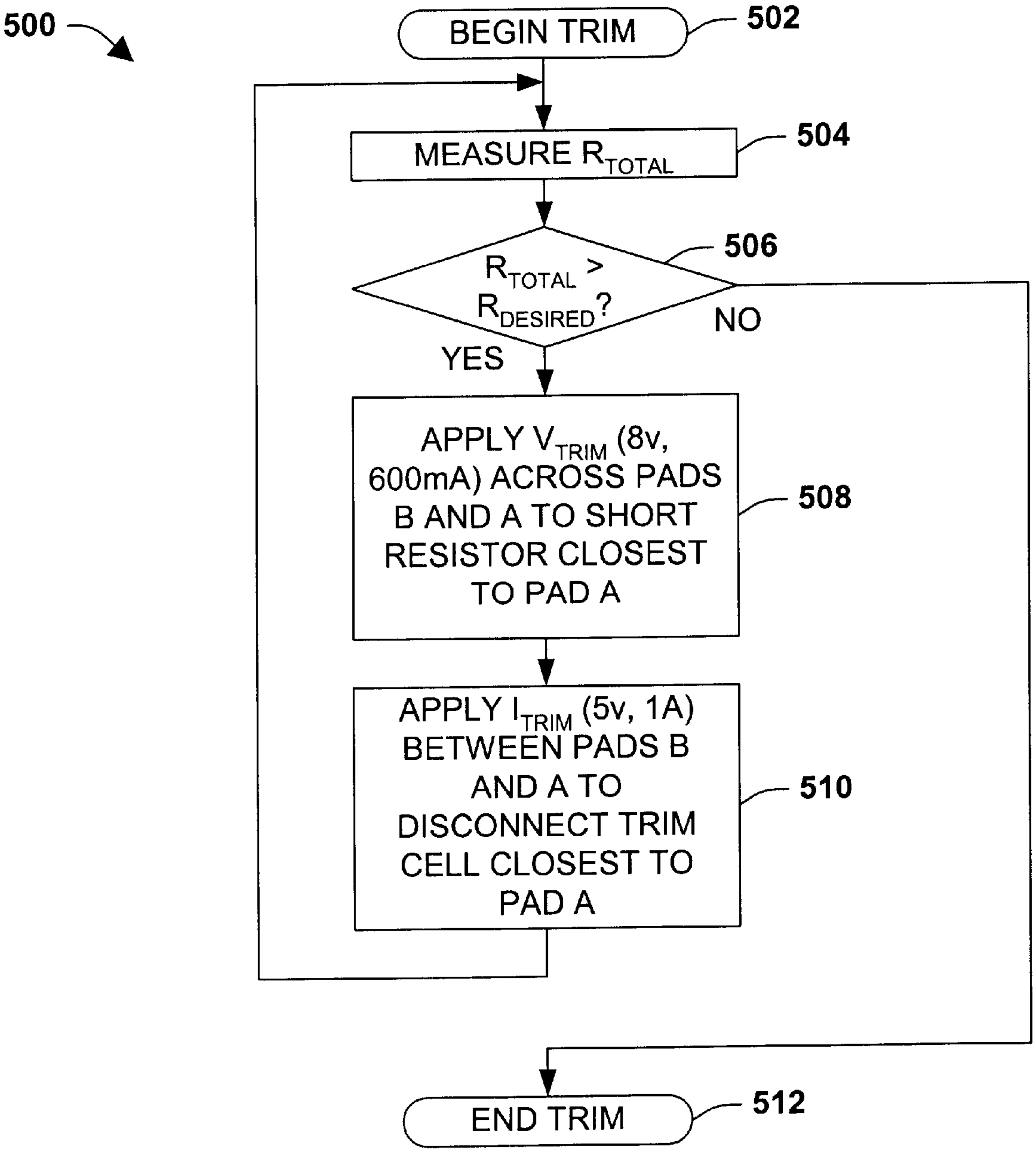
FIG. 10 is a flow diagram illustrating an exemplary method for trimming an electrical device in accordance with another aspect of the invention.

Referring now to FIG. 10, another aspect of the invention provides methods for trimming an electrical device to selectively remove resistance between two nodes in the device. An exemplary method 500 is illustrated in FIG. 10 in accordance with the invention, which may be employed in association with the exemplary multi-bit trim circuit 302 illustrated and described above. Although the method 500 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of the trim circuitry illustrated and described herein as well as in association with other devices not illustrated.

Beginning at 502, a measurement of the total resistance $R_{TOTAL}$ is performed at 504, and a determination is made at 506 as to whether the total resistance $R_{TOTAL}$ is greater than a desired resistance $R_{DESIRED}$. If so (YES at 506), a trim voltage $V_{TRIM}$ is applied at 508 across trim circuit trim pads (e.g., pads B and A of the circuit 302) so as to short-circuit a trim resistor (e.g., R1) closest to the first pad A. Thereafter at 510, a trim current $I_{TRIM}$ is applied between the pads to disconnect the closest trim cell from the other pad B. The resistance $R_{TOTAL}$ is again measured at 504, and a determination is made at 506 as to whether further trimming is desired (e.g., whether the measured resistance $R_{TOTAL}$ is still greater than the desired resistance $R_{DESIRED}$). The method 500 continues in this fashion through successive applications of trim voltages and currents at 508 and 510, with intervening measurements of the resistance $R_{TOTAL}$ at 504, until the desired value is attained (NO at 506), after which the method 500 ends at 512.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A trim circuit for providing a selectively removable resistance between first and second nodes in an electrical device, comprising:

a resistor comprising a resistor body and first and second ends and providing an electrical resistance between the first and second nodes, the first end of the resistor being connected to the first node and to a first pad in the electrical device; and a diode formed in the resistor body and comprising an anode, a cathode, and a conductive portion connected to one of the anode and the cathode, the anode being connected to the second end of the resistor, and the cathode being connected to a second pad in the electrical device;

wherein the conductive portion of the diode connects the first and second ends of the resistor so as to remove resistance between the first and second nodes after a trim voltage is applied across the first and second pads.

2. The trim circuit of claim 1, wherein comprises a resistor body extending in a substrate between the first and send the resistor body is doped with a dopant of a first type, wherein the diode comprises a diode body portion in the resistor body the diode body portion being doped with a dopant of a second type, wherein the first and second dopant types are different from one another.

3. The trim circuit of claim 2, wherein the conductive portion of the diode comprises a conductive contact structure formed over the diode body portion, the conductive contact structure being connected to the second pad, wherein application of the trim voltage across the first and second pads melts the conductive contact structure and distributes conductive material from the conductive contact structure along the resistor body between the first and second ends to connect the first and second ends of the resistor.

4. The trim circuit of claim 3, wherein the anode is connected to the second node.

5. The trim circuit of claim 3, comprising a fixed resistor connected between the anode and the second node.

6. The trim circuit of claim 3, wherein the cathode is connected to the second pad.

7. The trim circuit of claim 3, further comprising a fuse connected between the cathode and the second pad, the fuse being operable to selectively disconnect the cathode from the second pad after a trim current is applied between the first and second pads.

8. The trim circuit of claim 7, wherein the anode is connected to the second node, and wherein application of the trim voltage across the first and second pads removes electrical resistance between the first and second nodes and wherein application of the trim current disconnects the second pad from the first and second nodes.

9. The trim circuit of claim 1, further comprising a fuse connected between the cathode and the second pad, the fuse being operable to selectively disconnect the cathode from the second pad after a trim current is applied between the first and second pads.

10. The trim circuit of claim 9, wherein the conductive portion of the diode is connected to the second pad and to the cathode, wherein application of the trim voltage across the first and second pads melts the conductive contact structure and distributes conductive material from the conductive contact structure along the resistor between the first and second ends to connect the first and second ends of the resistor.

11. A multi-bit trim circuit for providing a selectively removable resistance between first and second nodes in an electrical device, comprising:

a first trim cell connected to the first node and to first and second pads in the electrical device; and a second trim cell connected between the first trim cell and the second node;

wherein the first and second trim cells individually comprise:

a resistor comprising a resistor body extending in a substrate between first and second ends and providing an electrical resistance between the first and second nodes; and a diode formed in the resistor body and comprising an anode, a cathode, and a conductive portion connected to the cathode, the anode being connected to the second end of the resistor, the cathode being connected to the second pad, and the conductive portion connecting the first and second ends of the resistor.

12. The trim circuit of claim 11, wherein the first and second trim cells individually comprise a fuse connected between the cathode and the second pad, the fuse being operable to selectively disconnect the cathode from the second pad after a trim current is applied between the first and second pads.

13. The trim circuit of claim 12, further comprising a fixed resistor connected between the second trim cell and the second node.

14. The trim circuit of claim 12, wherein the resistor bodies of the first and second trim cells are individually doped with a dopant of a first type, wherein the diodes of the first and second trim cells individually comprise a diode body portion in the resistor body near the second end of the resistor, the diode body portion being doped with a dopant of a second type, wherein the first and second dopant types are different from one another.

15. The trim circuit of claim 14, wherein the conductive portions of the diode in the first and second trim cells individually comprise a conductive contact structure formed over the diode body portion, the conductive contact structure being connected to the second pad, wherein application of the trim voltage across the first an second pads melts the conductive contact structure and distributes conductive material from the conductive contact structure along the resistor body between the first and second ends to connect the first and second ends of the resistor.

16. The trim circuit of claim 15, wherein an initial application of the trim voltage across the first and second pads melts the conductive contact structure of the first trim cell to remove the electrical resistance associated with the first trim cell from the trim circuit, and wherein an initial application of the initial trim current between the first and second pads following application of the first initial trim voltage disconnects the cathode of the first trim cell from the second pad.

17. The trim circuit of claim 16, wherein a subsequent application of the trim voltage across the first and second pads following the initial application of the trim current melts the conductive contact structure of the second trim cell to remove the electrical resistance associated with the second trim cell from the trim circuit, and wherein a subsequent of the trim current between the first and second pads following application of the subsequent trim voltage disconnects the cathode of the second trim cell from the second pad.

18. The trim circuit of claim 12, wherein an initial application of the trim voltage across the first and second pads removes the electrical resistance associated with the first trim cell from the trim circuit, and wherein an initial application of the trim current between the first and second pads following application of the initial trim voltage disconnects the cathode of the first trim cell from the second pad.

19. The trim circuit of claim 18, wherein a subsequent application of the trim voltage across the first and second pads following the initial application of the trim current removes the electrical resistance associated with the second trim cell from the trim circuit, and wherein a subsequent of the trim current between the first and second pads following application of the subsequent trim voltage disconnects the cathode of the second trim cell from the second pad.

20. A trim circuit for providing a selectively removable resistance between first and second nodes in an electrical device, comprising:

a resistor comprising a resistor body and first and second ends and providing an electrical resistance between the first and second nodes, the first end of the resistor being connected to the first node and to a first pad, and the second end of the resistor being connected to the second node;

a diode, formed in said resistor body and comprising an anode connected to the second end of the resistor, a cathode, and a conductive portion connected to the cathode to electrically connect the first and second ends of the resistor after a trim voltage is applied across the first and second pads; and a fuse connected between the conductive portion of the diode and a second pad to selectively disconnect the cathode from the second pad after a trim current is applied between the first and second pads.

21. The trim circuit of claim 20, wherein the resistor body is doped with a dopant of a first type, wherein the diode comprises a diode body portion in the resistor body, the diode body portion being doped with a dopant of a second type, wherein the first and second dopant types are different from one another.

22. The trim circuit of claim 21, wherein the conductive portion of the diode comprises a conductive contact structure formed over the diode body portion, the conductive contact structure being connected to the fuse, wherein application of the trim voltage across the first and second pads melts the conductive contact structure and distributes conductive material from the conductive contact structure along the resistor body between the first and second ends to electrically short the first and second pads of the resistor so as to remove at least a portion of the electrical resistor between the first and second nodes.

23. The trim circuit of claim 22, further comprising a fixed resistor connected between the anode and the second nod.

24. A method of trimming an electrical device to selectively remove resistance between two nodes in the device, the method comprising:

applying a trim voltage across first and second pads in the electrical device to short a first resistor in a first trim cell between the two nodes, applying a trim current between the first and second pads to disconnect the first trim cell from the second pad;

determining if further trimming is needed; and repeating application of the trim voltage and the trim current to remove further resistance the two nodes if further trimming is needed.

25. The method of clam 24, wherein applying the trim voltage comprises applying about 8 volts at about 600 mA across the first and second pads to short the first resistor.

26. The method of claim 25, wherein applying the trim voltage comprises melting a conductive portion of a diode in the first trim call to short-circuit the first resistor.

27. The method of claim 25, wherein applying the trim current comprises applying about 5 volts at about 1 A between the first and second pads to disconnect the first trim cell from the end pad.

28. The method of claim 27, wherein applying the trim current comprises open circuiting a fuse between the first trim cell and the second pad.

29. The method of claim 25, wherein applying the trim voltage comprises melting a conductive portion of a decode in the first trim cell to short-circuit the first resistor.

* * * * *